(12) United States Patent  
Kim

(10) Patent No.: US 6,855,591 B2
(45) Date of Patent: Feb. 15, 2005

(54) NONVOLATILE MEMORY DEVICE HAVING STI STRUCTURE AND METHOD OF FABRICATING THE SAME

(75) Inventor: Sun-Young Kim, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 12 days.

(21) Appl. No.: 10/114,473

(22) Filed: Apr. 3, 2002

(65) Prior Publication Data

US 2002/0182806 A1 Dec. 5, 2002

(30) Foreign Application Priority Data

Jun. 1, 2001 (KR) ........................................ 2001-30818

(51) Int. Cl.[7] .............................................. H01L 21/76
(52) U.S. Cl. ...................... 438/221; 438/258; 438/296; 438/424; 438/673; 438/701
(58) Field of Search ................................ 438/201, 211, 438/221, 258, 296, 424, 593, 673, 701, 713, 978, FOR 458, FOR 492

(56) References Cited

U.S. PATENT DOCUMENTS

| | | | | |
|---|---|---|---|---|
| 5,843,226 A | * | 12/1998 | Zhao et al. .................... | 117/97 |
| 6,172,395 B1 | | 1/2001 | Chen et al. .................. | 257/315 |
| 6,232,185 B1 | * | 5/2001 | Wang ......................... | 438/266 |
| 6,309,928 B1 | * | 10/2001 | Sung et al. .................. | 438/265 |
| 6,342,716 B1 | | 1/2002 | Morita et al. ................ | 257/315 |
| 6,455,440 B1 | * | 9/2002 | Jeng .......................... | 438/770 |
| 6,548,374 B2 | * | 4/2003 | Chung ........................ | 438/424 |
| 2002/0072197 A1 | * | 6/2002 | Kang et al. ................. | 438/424 |
| 2002/0080659 A1 | * | 6/2002 | Shin et al. .................. | 365/200 |
| 2002/0195645 A1 | * | 12/2002 | Takada et al. .............. | 257/314 |

OTHER PUBLICATIONS

Aritome et al. a 0.67 Self–Aligned Shallow Trench Isolation Cell, etc., 1994, 3.6.1–3.6.4., ULSI Research Labs.).

* cited by examiner

Primary Examiner—George Fourson
Assistant Examiner—Joannie Adelle Garcia
(74) Attorney, Agent, or Firm—Lee & Sterba, P.C.

(57) ABSTRACT

A nonvolatile memory device and a method of forming the nonvolatile memory device having a shallow trench isolation structure and having a device isolation layer having a protruding portion above a substrate surface includes forming a gate oxide, a lower conductive layer pattern, and a hard mask layer; patterning the hard mask layer; isotropically etching the lower conductive layer to form a lower conductive layer pattern having a sloped sidewall profile where a width of a lower portion of the lower conductive layer pattern is smaller than a width of an upper portion of the lower conductive layer pattern; etching the gate oxide layer and the substrate, using the hard mask pattern as an etch mask, to form a trench; and forming a device isolation layer contacting with a sidewall of the lower conductive layer pattern in the trench.

8 Claims, 8 Drawing Sheets

NONVOLATILE MEMORY DEVICE HAVING STI STRUCTURE AND METHOD OF FABRICATING THE SAME

BACKGROUND OF THE INVENTION

1. Field of the Invention

The present invention relates generally to a semiconductor device and a method of fabricating the same. More specifically, the present invention is directed to a nonvolatile memory device having a shallow trench isolation (STI) structure and a method of fabricating the same.

2. Description of the Related Art

As the trend in the field of semiconductor devices continues toward higher density integration, the demand and need for decreasing the fine linewidth of a gate and the width of a device isolation layer also grows. Shallow trench isolation (STI) technology has become more widely adopted and used than local oxidation of silicon (LOCOS) technology because a narrower and deeper device isolation layer can be formed. However, STI technology requires the use of a diffusion barrier layer to prevent deterioration of an interface between a semiconductor substrate and a device isolation layer, and a groove is formed between the device isolation layer and an active region. This results in generation of a leakage current and deterioration of a gate oxide layer. In order to overcome such problems, a self-aligned trench technology has recently been employed in which a gate oxide layer is formed during formation of a trench isolation layer to simplify the process. Since the trench isolation layer is formed after formation of the gate oxide layer and ion implantation, the conventional problems associated with STI technology can be solved. Unfortunately, in spite of the foregoing advantages, the self-aligned trench technology suffers from several problems that occur while fabricating semiconductor devices.

FIG. 1 illustrates a top, plan view for explaining a general nonvolatile memory, in which region "a" represents a cell array region and region "b" represents a peripheral circuit region.

Referring now to FIG. 1, device isolation layers 108 (208) are disposed over a semiconductor substrate in the cell array region "a" along one direction. A plurality of control gate electrodes 112 is located across an active region 106 between the device isolation layers 108 (208). A floating gate "F" is disposed between the control gate electrode 112 and the active region 106. A transistor in the peripheral circuit region "b" includes a gate electrode 114 crossing an active region 107 defined by the device isolation layers 108 (208).

FIGS. 2 through 4 illustrate flow diagrams for explaining problems of a conventional memory device, which are taken along a line I-I' of FIG. 1.

Referring now to FIG. 2, a gate oxide layer 102, a lower conductive layer 104, and a hard mask layer 105 are sequentially formed on a semiconductor substrate 100 with a cell array region "a" and a peripheral circuit region "b". Thickness of the gate oxide layer may be different in the cell array region and the peripheral circuit region. The hard mask layer 105, the lower conductive layer 104, and the gate oxide layer 102 are sequentially patterned to form a lower conductive pattern 104 and a hard mask pattern 105 that are sequentially stacked in the cell array region "a" and the peripheral circuit region "b". The cell gate oxide layer (tunnel oxide layer) 102 is disposed between the lower conductive pattern 104 and the semiconductor substrate 100 in the cell array region "a". Also, the gate oxide layer 102 is disposed between the lower conductive layer pattern 104 and the semiconductor substrate 100 in the peripheral circuit region "b". Using the hard mask pattern 105 as an etch mask, the semiconductor substrate 100 is etched to form a trench area "T" and to define first and second active regions 106 and 107 in the regions "a" and "b", respectively.

Referring now to FIG. 3, a device isolation layer 108 is formed in the trench area "T" by first forming an insulating layer to fill the trench area "T". The insulting layer is then etched to expose the hard mask pattern 105 using a chemical mechanical polishing (CMP) technique and thereafter recessed to form the device isolation layer 108.

Prior to the formation of the insulating layer, defects in the semiconductor substrate that formed during formation of the trench area "T" are recovered by a process whereby a thermal oxide layer is formed. In this process, a sidewall of the lower conductive pattern 104 is also oxidized, and an edge of the lower conductive layer pattern 104 is bent by a tensile stress applied thereto. Thus, the lower conductive pattern 104 has a structure where the width at a lower portion is larger than the width at an upper portion. Also, the device isolation layer 108 protruding into the semiconductor substrate 100 has a structure where the width at an upper portion is larger than the width at a lower portion.

Referring now to FIG. 4, hard mask patterns 105 on the first and second active regions 106 and 107 are removed. Generally, the hard mask layer is made of silicon nitride, and the hard mask patterns 105 may be etched by wet etch using the solution of phosphoric acid. An upper conductive layer is formed over the entire surface of the semiconductor substrate from which the hard mask patterns 105 have been removed. The upper conductive layer is then patterned to form a floating gate pattern, which comprises the upper and lower conducive layer 104, on the first active region 106. A gate interlayer dielectric film and a control gate conductive layer are formed to cover the cell array region "a". In the cell array region "a", the control gate conductive layer, the gate interlayer dielectric film, and the floating gate pattern are sequentially patterned to form a control gate electrode (112 of FIG. 1) crossing the first active region 106 and a floating gate ("F" of FIG. 1) disposed between the gate electrode (112 of FIG. 1) and the first active region 106. The gate electrode 114 consists of a lower gate electrode 104 and an upper gate electrode 111. In the peripheral circuit region "b", the upper conductive layer and lower conductive layer 104 are sequentially patterned to form a gate electrode 114 crossing the second active region.

In the prior art, an upper width of the device isolation layer 108 protruding into the semiconductor substrate is larger than a lower width thereof. This causes a stringer 113, which remains along a boundary of the first and second active regions 106 and 107 in a process for forming a control gate (not shown) in the cell array region "a" and a gate electrode 114 in the peripheral circuit region "b". Since the stringer electrically connects adjacent floating gates "F" (see FIG. 1) in the cell array region "a" to each other, it is difficult to program one cell transistor independently.

SUMMARY OF THE INVENTION

With a view towards avoiding the shortcomings and problems of the prior art, the present invention provides a nonvolatile semiconductor memory having a device isolation layer structure for preventing the formation of a stringer along a boundary of a device isolation layer and an active region, and provides a method of fabricating the same.

According to an aspect of the present invention, there is provided a nonvolatile semiconductor device, comprising trench isolation layers formed in a semiconductor substrate, each trench isolation layer having a protruding portion having a height that is higher than a height of a surface of the semiconductor substrate; a control gate electrode crossing an active region between the trench isolation layers; a floating gate disposed between the control gate electrode and the active region; a gate interlayer dielectric film disposed between the floating gate and the control gate electrode; and a tunnel oxide layer disposed between the floating gate and the active region, wherein the protruding portion of each trench isolation layer has a sidewall profile where a width of an upper portion of the protruding portion is smaller than a width of a lower portion of the protruding portion.

The floating gate may consist of a lower floating gate formed on an active region between the trench isolation layers, and an upper floating gate formed on the lower floating gate to partially overlap the device isolation layer. The control gate electrode may be made of polysilicon or polysilicon and metal silicide, which are sequentially stacked.

According to another embodiment of the present invention, there is provided a nonvolatile memory device comprising a semiconductor substrate with a cell array region and a peripheral circuit region; device isolation layers formed in a substrate in the cell array region and the peripheral circuit region, each device isolation layer having a protruding portion having a height that is higher than a height of the substrate, and defining a first active region and a second active region in the cell array region and in the peripheral circuit region, respectively; a control gate electrode crossing the first active region in the cell array region; a floating gate disposed between the control gate electrode and the first active region; a gate interlayer dielectric film disposed between the floating gate and the control gate electrode; a tunnel oxide layer disposed between the floating gate and the first active region; a gate electrode crossing the second active region between the device isolation layers in the peripheral circuit region; and a gate oxide layer disposed between the gate electrode and the second active region, wherein the protruding portion of each device isolation layer has a sidewall profile where a width of an upper portion of the protruding portion is less than a width of a lower portion of the protruding portion.

The floating gate may consist of a lower floating gate formed on the first active region, and an upper floating gate formed on the lower floating gate to partially overlap the device isolation layer. The gate electrode may consist of a lower gate electrode formed on the second active region, and an upper gate electrode formed on the lower gate electrode to partially overlap the device isolation layer. The upper gate electrode may be made of polysilicon or polysilicon and metal silicide, which are sequentially stacked. The control gate electrode may be made of polysilicon or polysilicon and metal silicide, which are sequentially stacked. The nonvolatile memory device may further comprise a capping insulating layer formed over the control gate electrode and the gate electrode.

According to another aspect of the present invention, there is provided a method of fabricating a nonvolatile memory device, comprising the steps of forming a gate oxide layer, a lower conductive layer pattern, and a hard mask pattern which are sequentially stacked, the lower conductive layer pattern having a sloped sidewall profile where a width of a lower portion of the lower conductive layer pattern is smaller than a width of an upper portion of the lower conductive layer pattern; etching the substrate, using the hard mask pattern as an etch mask, to form a trench area; forming a device isolation layer in the trench area; and removing the hard mask pattern to expose a top surface of the lower conductive layer pattern.

The hard mask pattern may be made of silicon nitride. The hard mask pattern may be made of silicon nitride and oxide which are sequentially stacked. The lower conductive layer pattern may be made of undoped or doped polysilicon. The device isolation layer may be made of O3- tetra-ethyl-orthosilicate (TEOS) oxide or high density plasma (HDP) CVD oxide.

The method of fabricating a nonvolatile memory device according to the present invention may further comprise a step of forming a thermal oxide layer on the surface of the trench area prior to formation of the device isolation layer. The step of forming the gate oxide layer, the lower conductive layer pattern, and the hard mask pattern may further include the steps of sequentially forming an oxide layer, a lower conductive layer pattern, and a hard mask layer on the substrate; forming a photoresist pattern on the hard mask layer; anisotropically etching the hard mask layer, using the photoresist pattern as etch mask, to form a hard mask pattern; etching the lower conductive layer, using the photoresist pattern as an etch mask, to form a lower conductive layer pattern having a sloped sidewall profile where an upper width is greater than a lower width; etching the gate oxide layer, using the photoresist pattern as an etch mask, to expose the substrate; and removing the photoresist pattern.

These and other features of the present invention will be readily apparent to those of ordinary skill in the art upon review of the detailed description that follows.

BRIEF DESCRIPTION OF THE DRAWINGS

The invention, together with its features and the advantages thereof, may best be understood by reference to the following detailed description taken in conjunction with the accompanying drawings of which.

DETAILED DESCRIPTION OF THE INVENTION

Figure 1:
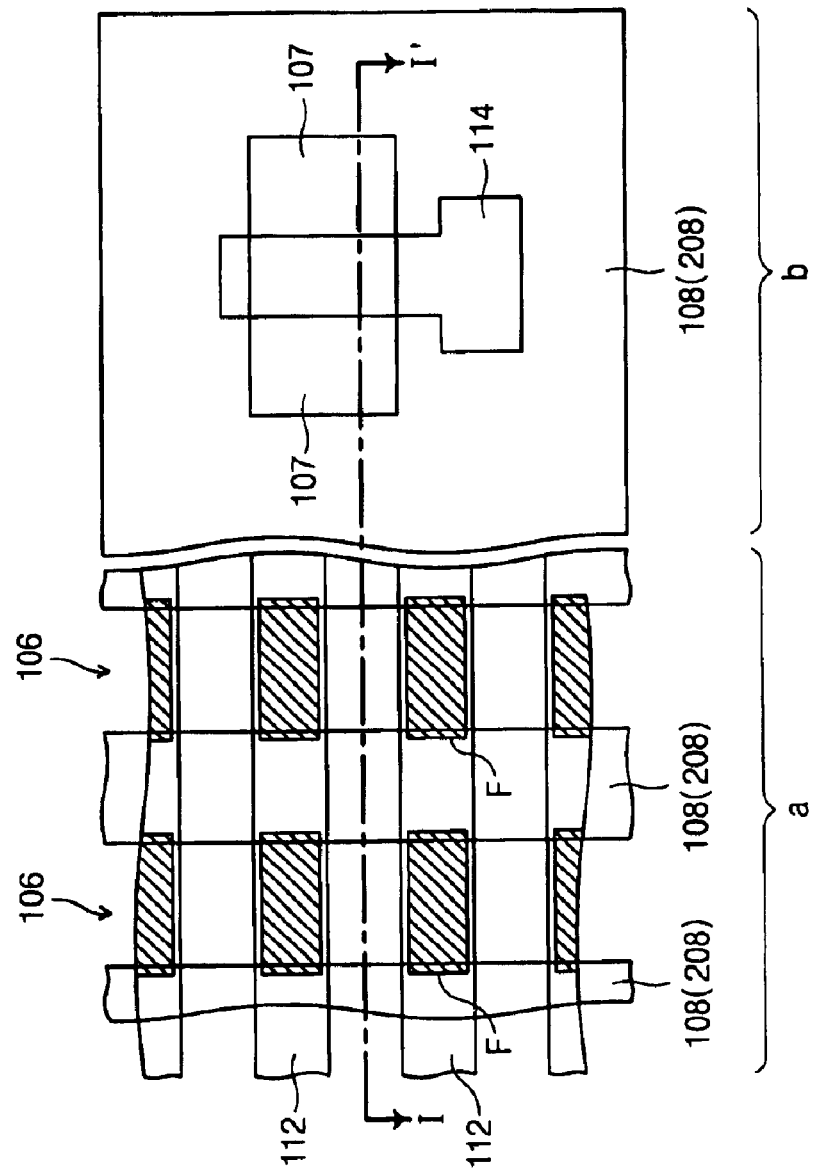
FIG. 1 illustrates a top, plan view of a conventional nonvolatile memory device.
Figure 2:
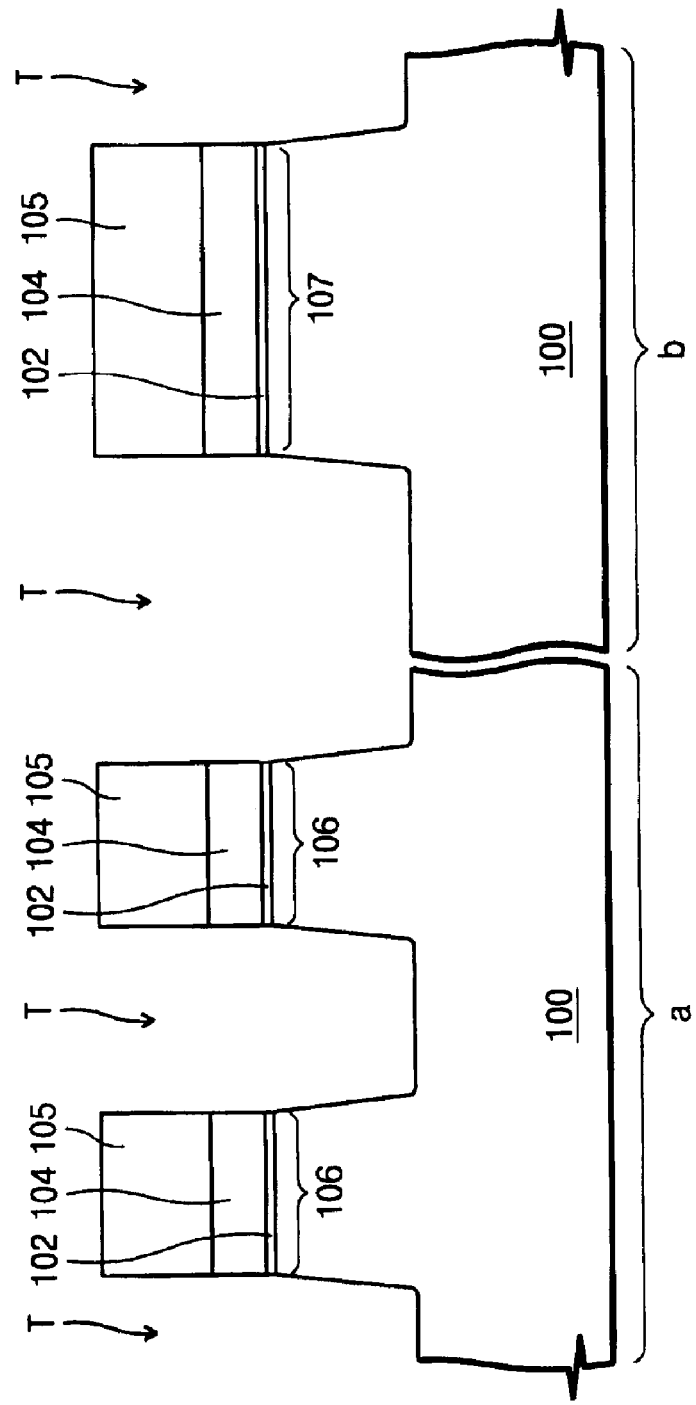
FIGS. 2 through 4 illustrate various manufacturing steps of a conventional nonvolatile memory device, taken along a line I-I' of FIG. 1.
Figure 3:
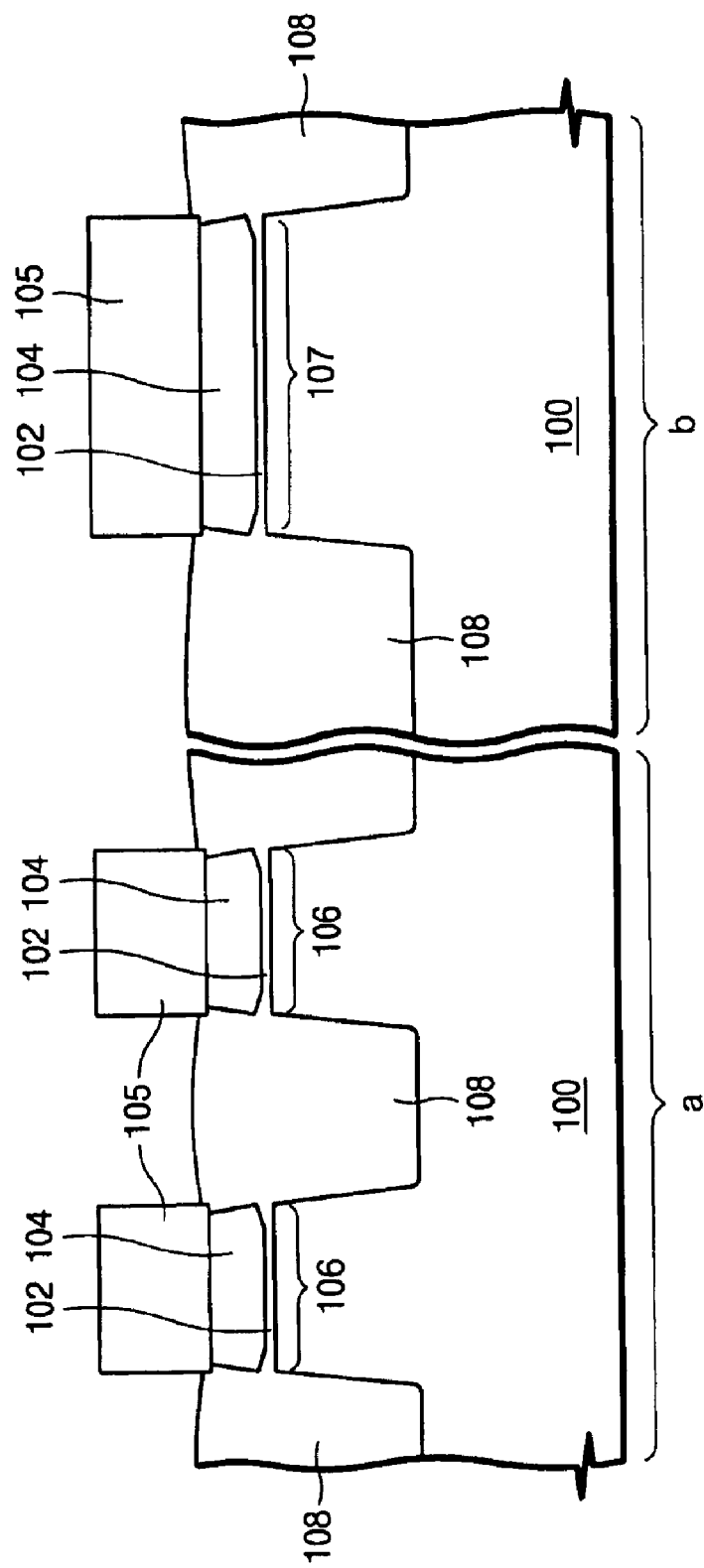
Figure 4:
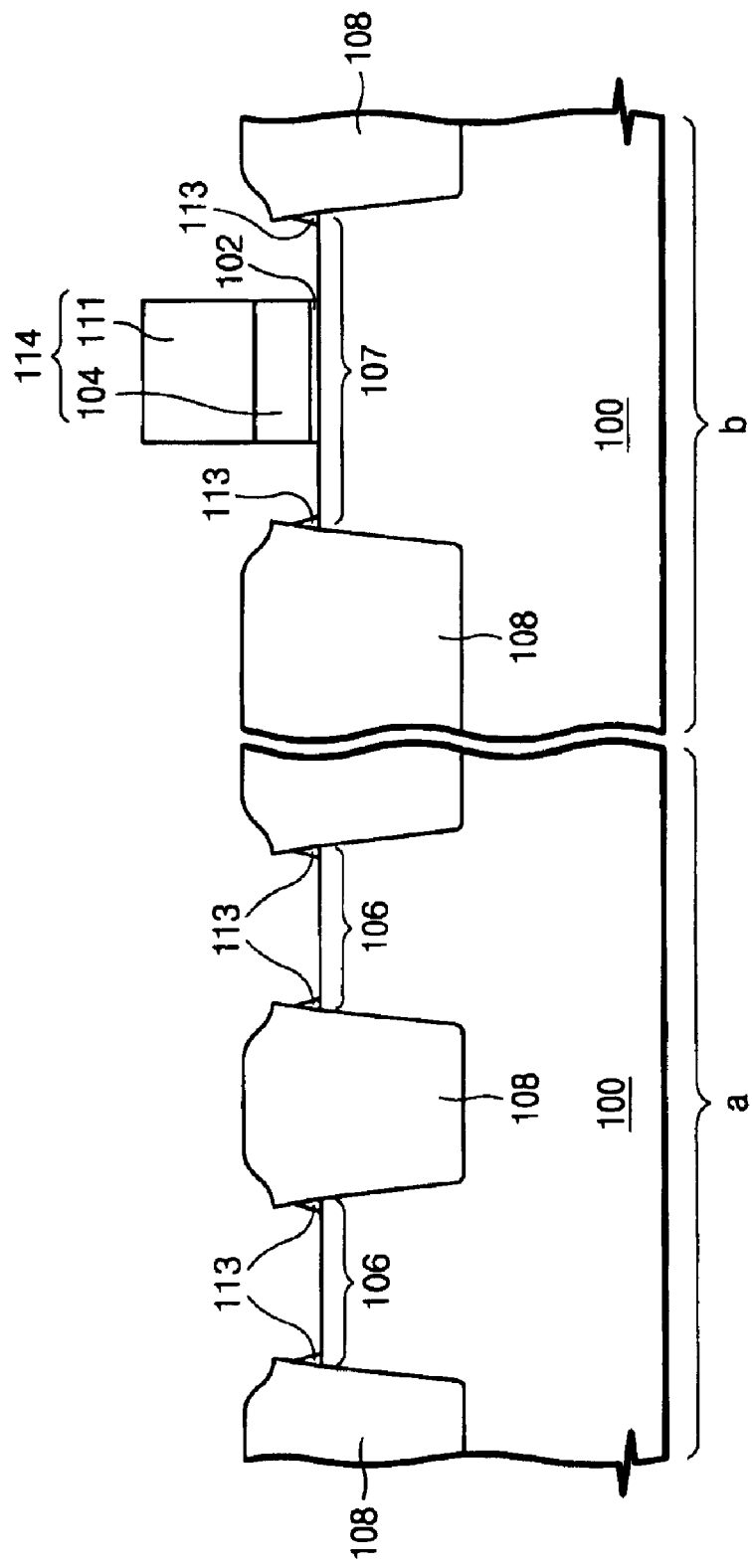

Korean Patent Application No. 2001-30818, filed on Jun. 1, 2001, and entitled: "Nonvolatile Memory Device Having STI Structure and Method of Fabricating the Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

Figure 5:
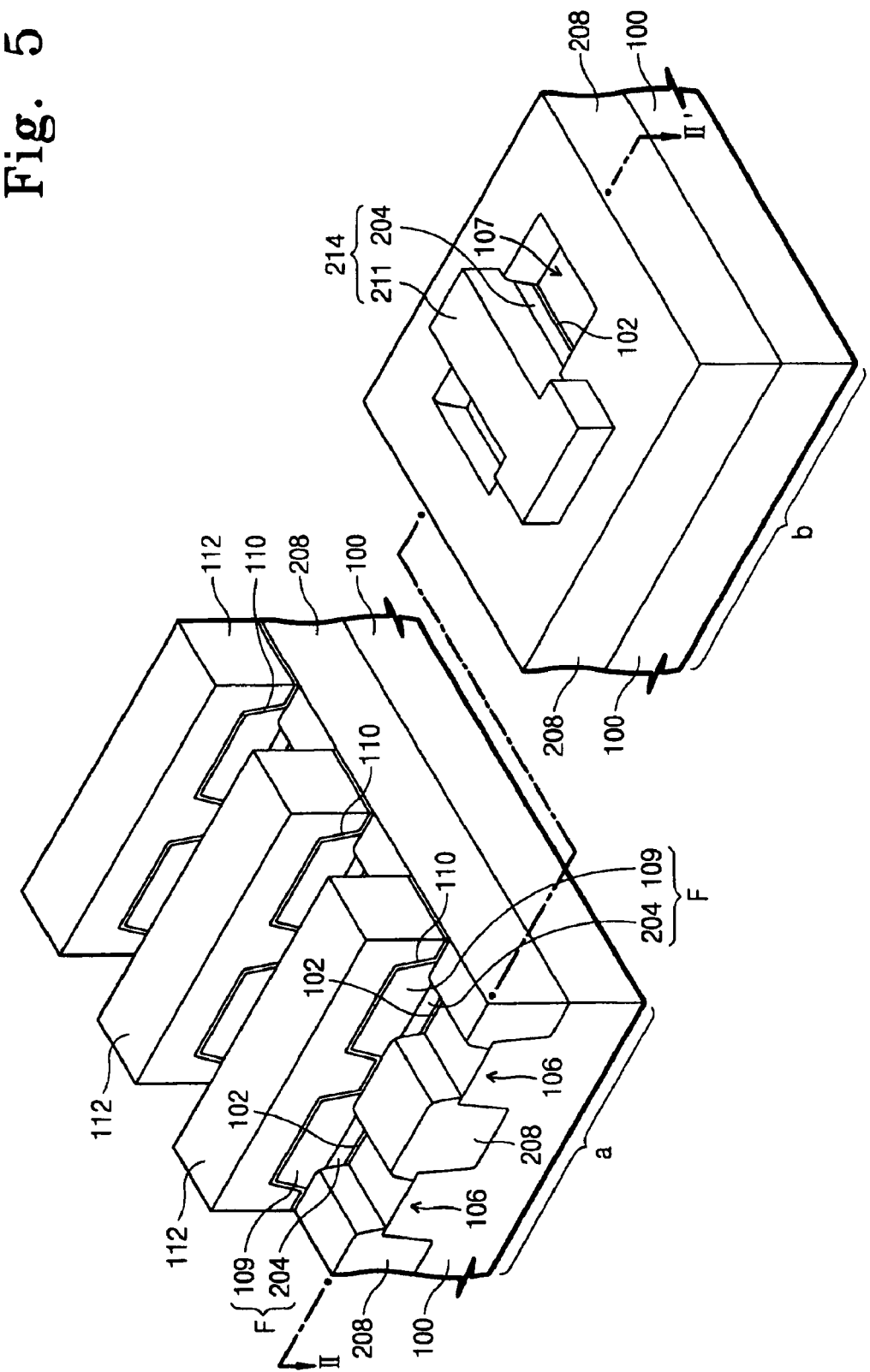
FIG. 5 illustrates a perspective view of a nonvolatile memory device according to the present invention.

Referring now to FIG. 5, a cell array region "a" of a nonvolatile memory device according to the present invention includes a plurality of parallel device isolating layers 208 formed on a semiconductor substrate 100, and a plurality of control gate electrodes 112 each crossing the device isolation layers 208. The device isolation layer 208 has a protruding portion that is higher than the surface of the semiconductor substrate. A lower width of the protruding portion is larger than an upper width thereof. Therefore, unlike in a conventional nonvolatile memory, it is possible to prevent a stringer from remaining at a boundary of the device isolation layer 208 and an active region 106 in the processing of patterning the control gate electrode 112 and the floating gate "F".

Each of the control gate electrodes 112 crosses a first active region 106 between the device isolation layers 208. The floating gate "F" is disposed between the control gate electrode 112 and the first active region 106. The floating gate "F" consists of a lower floating gate 204 on the first active region 106, and an upper floating gate 109 covering the lower floating gate 204 and partially overlapping with the device isolation layer 208. Also the floating gate "F" is insulated from the first active region 106 by a tunnel oxide layer 102, and is insulated from the control gate electrode 112 by a gate interlayer dielectric film 110. The control gate electrode 112 may be made of polysilicon, or polysilicon and metal suicide that are stacked. A capping insulating layer may further be formed over the control gate electrode 112.

A peripheral circuit region "b" of the nonvolatile memory device includes a device isolation layer 208 and a gate electrode 214 that are formed on a semiconductor substrate 100. The gate electrode 214 crosses a second active region 107 between the device isolation layers 208. Also the gate electrode 214 consists of a lower gate electrode 204 on the second active region 107 and an upper gate electrode 211 crossing the second active region and covering the lower gate electrode 204. A gate oxide layer 102 is disposed between the second active region 107 and the gate electrode 214. The upper gate electrode 211 is made of polysilicon, or polysilicon and metal silicide that are stacked. A capping insulating layer may further be formed over the control gate electrode 214.

A preferred embodiment of the present invention will now be described herein below with reference to FIG. 6 through FIG. 8, taken along line II-II' of FIG. 5.

Figure 6:
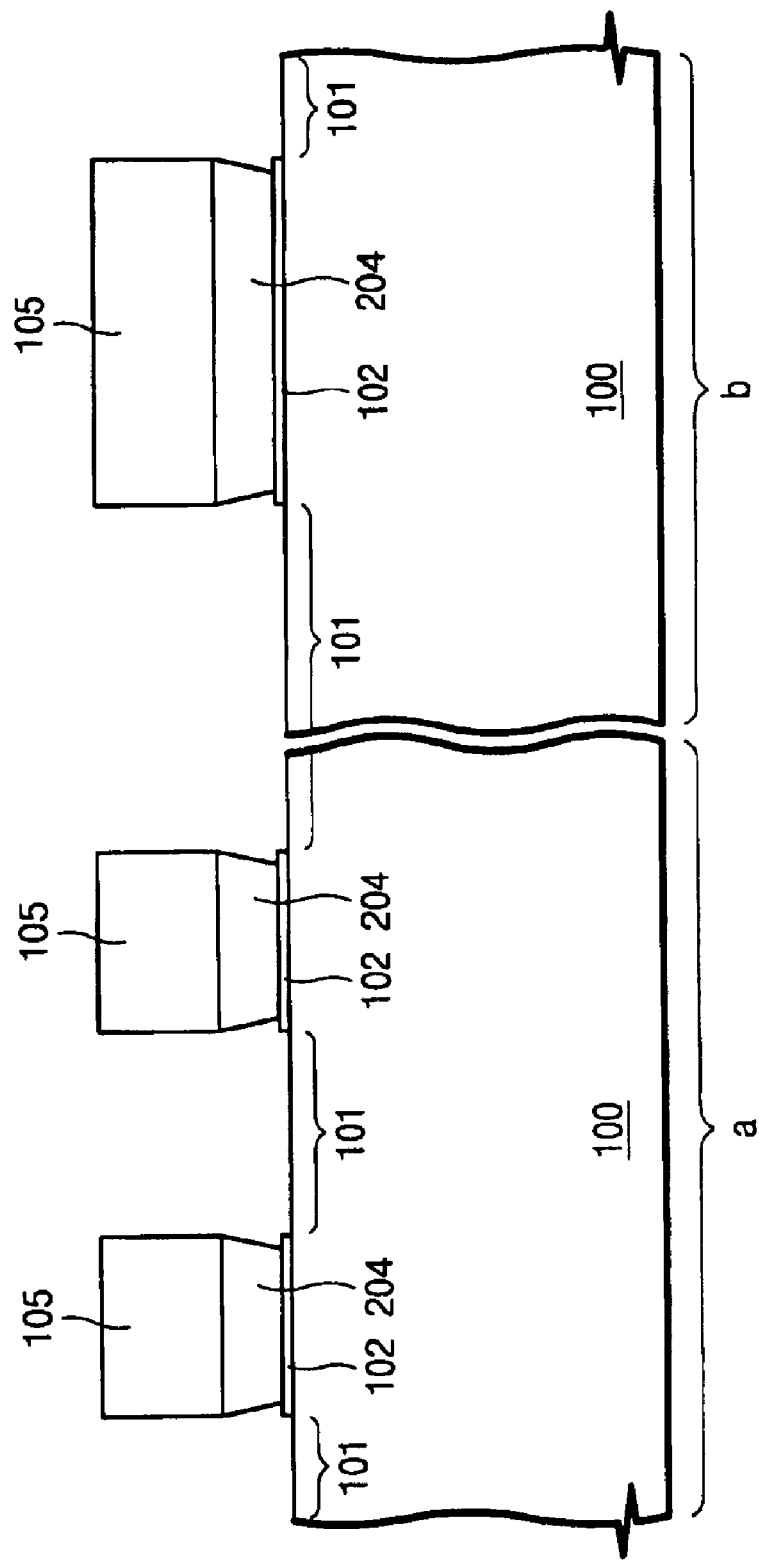
FIGS. 6 through 8 illustrate various manufacturing steps of a nonvolatile memory device according to the present invention, taken along line II-II' of FIG. 5.

Referring now to FIG. 6, an oxide layer 102, a lower conductive layer 204, and a hard mask layer 105 are sequentially formed on a semiconductor substrate having a cell array region "a" and a peripheral circuit region "b". The thickness of the oxide layers in the cell array region "a" and in the peripheral circuit region "b" may be different. The lower conductive layer may be made of polysilicon, either doped or undoped. The hard mask layer is made of a material having an etch selectivity with respect to the semiconductor substrate 100, e.g., silicon nitride or silicon nitride and oxide that are stacked.

The hard mask layer 105, the lower conductive layer 204, and the oxide layer 102 are patterned to expose a device isolation area 101. In the process of exposing the device isolation area 101, a photoresist pattern (not shown) is formed on the hard mask layer 105. Using the photoresist pattern as an etch mask, the hard mask layer 105 is etched to form a hard mask pattern 105. Using the photoresist pattern as an etch mask, the lower conductive layer 204 is etched to form a lower conductive layer pattern 204. In this case, the lower conductive layer pattern 204 has a sloped sidewall profile where the width at an upper portion is larger than the width at a lower portion.

Specifically, after formation of the hard mask pattern 105, $CF_4$ gas of 40 sccm is introduced to remove native oxide as well as particles on the exposed lower conductive layer 204 in a chamber under a pressure of 25 mT and at a plasma power of 300W for about five seconds. After changing the chamber pressure to 30 mT and applying a plasma power of 250W, HBr of 90 sccm, $Cl_2$ of 30 sccm and a mixture gas of He and $O_2$ of 8 sccm are introduced to suppress production of polymer in the etching process. Then, the lower conductive layer 204 is etched. If a mixed gas of He and $O_2$ increases in amount, a lower conductive layer pattern 204 has a sidewall profile where a difference between the width at an upper portion and the width at a lower portion becomes greater. As the ratio of $Cl_2$ to HBr is increased, the difference between the width at an upper portion and the width at a lower portion also increases.

Using the photoresist pattern as an etch mask, the oxide layer is etched to expose a device isolation area 101. As a result, a tunnel oxide layer 102, a lower conductive layer pattern 204, and a hard mask pattern 105 are formed which are sequentially stacked on the cell array region "a", and a gate oxide layer 102, a lower conductive layer pattern 204 having a sloped sidewall profile, and a hard mask pattern 105 are formed which are sequentially formed on the peripheral circuit region "b".

Figure 7:
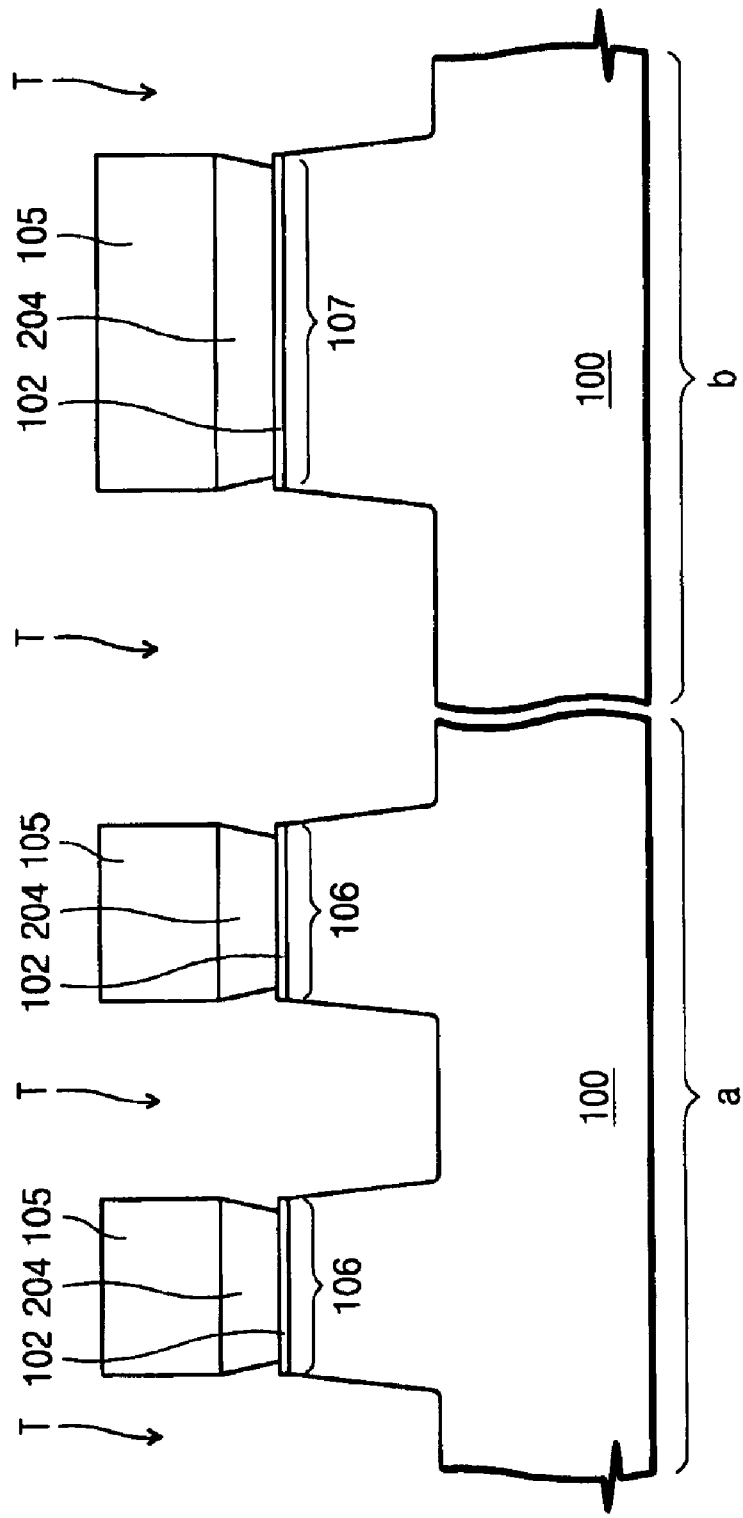

Referring now to FIG. 7, using the hard mask pattern 105 as an etch mask, the semiconductor substrate 100 is anisotropically etched to form a trench area "T" and define first and second active regions 106 and 107 in the cell array region "a" and the peripheral circuit region "b", respectively.

Figure 8:
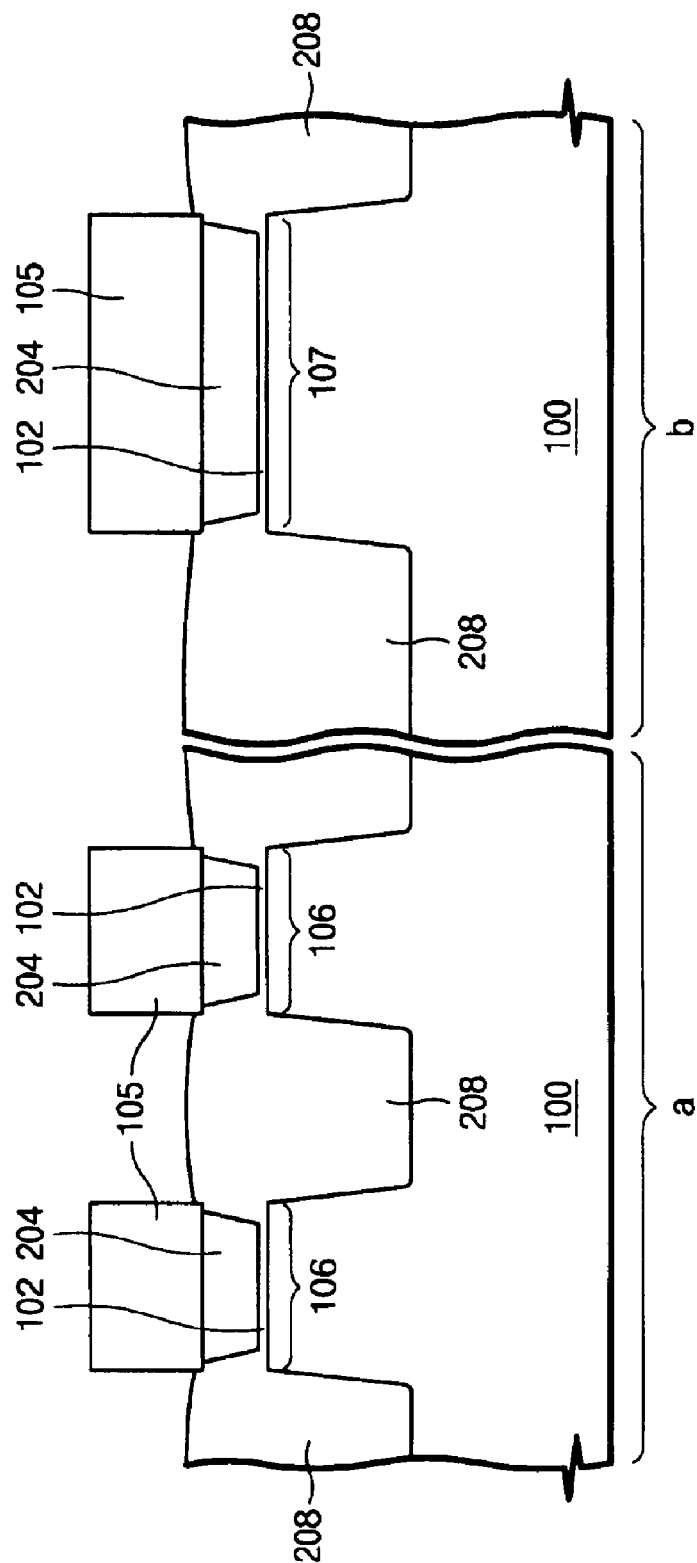

Referring now to FIG. 8, an insulating layer to fill the trench area "T" is formed on an entire surface of the semiconductor substrate where the trench area "T" is formed. This insulating layer intended for device isolation is made of $O_3$- tetra-ethyl-ortho-silicate(TEOS) oxide or high-density-plasma (HDP) CVD oxide. The insulating layer is etched by CMP to expose a top surface of the hard mask pattern 105 and form a device isolation layer 208 in the trench area "T". As a result, a protruding portion of the device isolation layer 208 has a sidewall profile where the width at a lower portion is greater than the width at an upper portion.

In order to recover a defect of the semiconductor substrate 100 which occurs during an etch process for forming the trench area "T", it is more preferable to further form a thermal oxide layer on a surface of the trench area "T" before formation of the insulating layer. Also ,the top surface of the device isolation layer 208 is preferably recessed to be lower than a height of the device isolation layer 208 protruding on the semiconductor substrate, after formation of the device isolation layer 208.

Although not shown in the drawing, the hard mask pattern 105 on the first and second active regions 106 and 107 is removed to expose the lower conductive layer pattern 204.

Subsequent processes are conventionally carried out to form a control gate electrode crossing the first active region 106 in the cell array region "a" and a gate electrode crossing the second active region 107 in the peripheral circuit region "b".

According to the present invention, the sidewall of the protruding portion of a device isolation layer is obliquely formed. Therefore, it is possible to prevent a stringer from remaining along a boundary of the device isolation layer and an active region while forming a gate electrode in a cell array region and a gate electrode in a peripheral circuit region.

In summary, the present invention makes it possible to prevent errors caused by a stringer formed at a boundary of a trench isolation layer and an active region, while writing, erasing, and reading a cell transistor. As a result of the present invention as disclosed and described above, production yield may be improved.

Preferred embodiments of the present invention have been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of fabricating a nonvolatile memory device, comprising the steps of:

forming a gate oxide layer, a lower conductive layer pattern, and a hard mask pattern, which are sequentially stacked on a substrate, the lower conductive layer pattern having a sloped sidewall profile where a width of a lower portion of the lower conductive layer pattern is smaller than a width of an upper portion of the lower conductive layer pattern;

etching the substrate, using the hard mask pattern as an etch mask, to form a trench area;

forming a device isolation layer in the trench area; and removing the hard mask pattern to expose a top surface of the lower conductive layer pattern.

2. A method of fabricating a nonvolatile memory device as claimed in claim 1, wherein the hard mask pattern is made of silicon nitride.

3. A method of fabricating a nonvolatile memory device as claimed in claim 1, wherein the hard mask pattern is made of silicon nitride and oxide which are sequentially stacked.

4. A method of fabricating a nonvolatile memory device as claimed in claim 1, wherein the lower conductive layer pattern is made of doped polysilicon.

5. A method of fabricating a nonvolatile memory device as claimed in claim 1, wherein the device isolation layer is made of $O_3$-tetra-ethyl-ortho-silicate(TEOS) oxide or high density plasma (HDP) CVD oxide.

6. A method of fabricating a nonvolatile memory device as claimed in claim 1, further comprising a step of forming a thermal oxide layer on a surface of the trench area prior to formation of the device isolation layer.

7. A method of fabricating a nonvolatile memory device as claimed in claim 1, wherein the step of forming the gate oxide layer, the lower conductive layer pattern, and the hard mask pattern further includes the steps of:

sequentially forming an oxide layer, a lower conductive layer, and a hard mask layer on the substrate;

forming a photoresist pattern on the hard mask layer;

anisotropically etching the hard mask layer, using the photoresist pattern as an etch mask, to form a hard mask pattern;

etching the lower conductive layer, using the photoresist pattern as an etch mask, to form a lower conductive layer pattern having a sloped sidewall profile where an upper width is greater than a lower width;

etching the gate oxide layer, using the photoresist pattern as an etch mask, to expose the substrate; and removing the photoresist pattern.

8. A method of fabricating a nonvolatile memory device as claimed in claim 7, wherein the lower conductive layer is etched using a mixture gas including He, $O_2$, $Cl_2$ and HBr gases as an etch gas.

* * * * *